United States Patent
Onishi

(10) Patent No.: US 9,768,764 B2
(45) Date of Patent: Sep. 19, 2017

(54) POWER CONVERSION APPARATUS

(71) Applicant: TOYOTA JIDOSHA KABUSHIKI KAISHA, Toyota-shi, Aichi-ken (JP)

(72) Inventor: Yukio Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/980,359

(22) Filed: Dec. 28, 2015

(65) Prior Publication Data

US 2016/0241011 A1    Aug. 18, 2016

(30) Foreign Application Priority Data

Feb. 12, 2015   (JP) .................................. 2015-025778

(51) Int. Cl.
  *H02M 3/08*   (2006.01)
  *H03K 17/082*   (2006.01)
  *H02M 1/32*   (2007.01)

(52) U.S. Cl.
  CPC ..... *H03K 17/0822* (2013.01); *H03K 17/0828* (2013.01); *H02M 1/32* (2013.01)

(58) Field of Classification Search
  CPC ...... H03K 17/0822; H02M 1/32; H02M 1/38; H02M 1/53806
  USPC ........... 361/93.1, 93.2, 93.7, 93.9, 100, 101; 363/50, 56.03, 56.04, 56.07, 56.1
  See application file for complete search history.

(56) References Cited

U.S. PATENT DOCUMENTS

| | | | |
|---|---|---|---|
| 6,396,721 B1 | 5/2002 | Sonoda et al. | |
| 2012/0075761 A1* | 3/2012 | Miura | H02M 1/32 361/93.1 |
| 2013/0088096 A1 | 4/2013 | Hashimoto et al. | |
| 2013/0286514 A1 | 10/2013 | Oguchi et al. | |
| 2014/0218833 A1* | 8/2014 | Wu | H03K 17/0828 361/93.1 |

FOREIGN PATENT DOCUMENTS

| | | |
|---|---|---|
| JP | 2001-161078 A | 6/2001 |
| JP | 2013-055830 A | 3/2013 |
| JP | 2014-147210 A | 8/2014 |
| WO | 2011/129263 A1 | 10/2011 |
| WO | 2012/086674 A1 | 6/2012 |

* cited by examiner

*Primary Examiner* — Nguyen Tran
(74) *Attorney, Agent, or Firm* — Oliff PLC

(57) ABSTRACT

A power conversion apparatus includes a first switching device at a high side and a second switching device at a low side. The first switching device and the second switching device are connected in series. The power conversion apparatus further includes a third switching device connected in series with the first switching device or the second switching device. Upon detection of an overcurrent flowing through one of the first switching device and the second switching device due to a short-circuit failure of another of the first switching device and the second switching device, the power conversion apparatus turns off the one of the first switching device and the second switching device, and turns off the third switching device.

5 Claims, 7 Drawing Sheets

POWER CONVERSION APPARATUS

BACKGROUND OF THE INVENTION

1. Field of the Invention

The present invention relates to a power conversion apparatus.

2. Description of the Related Art

In the related art, a short-circuit protection method is known where, if a short-circuit of one of a power switching device at a high side and a power switching device at a low side in an apparatus is detected, the other one of these power switching devices is turned off (for example, see International Patent Publication No. 2011/129263). This short-circuit protection method protects the other power switching device which is different from the power switching device having the short-circuit failure from the overcurrent otherwise flowing therethrough due to the short-circuit failure of the power switching device.

SUMMARY OF THE INVENTION

According to one aspect of the present invention, a power conversion apparatus includes a first switching device at a high side and a second switching device at a low side. The first switching device and the second switching device are connected in series. The power conversion apparatus further includes a third switching device connected in series with the first switching device or the second switching device. Upon detection of an overcurrent flowing through one of the first switching device and the second switching device due to a short-circuit failure of another of the first switching device and the second switching device, the power conversion apparatus turns off the one of the first switching device and the second switching device, and turns off the third switching device.

Other objects, features and advantages of the present invention will become more apparent from the following detailed description when read in conjunction with the accompanying drawings.

DETAILED DESCRIPTION OF THE EMBODIMENTS

For the purpose of convenience, the description of the above-mentioned related art will be continued first.

In the related art, it may be impossible to turn off the other switching device because, due to the short-circuit failure of the switching device, the voltage applied to the other switching device leaps. One example of such a case will now be described using FIGS. 1 and 2.

Figure 1:
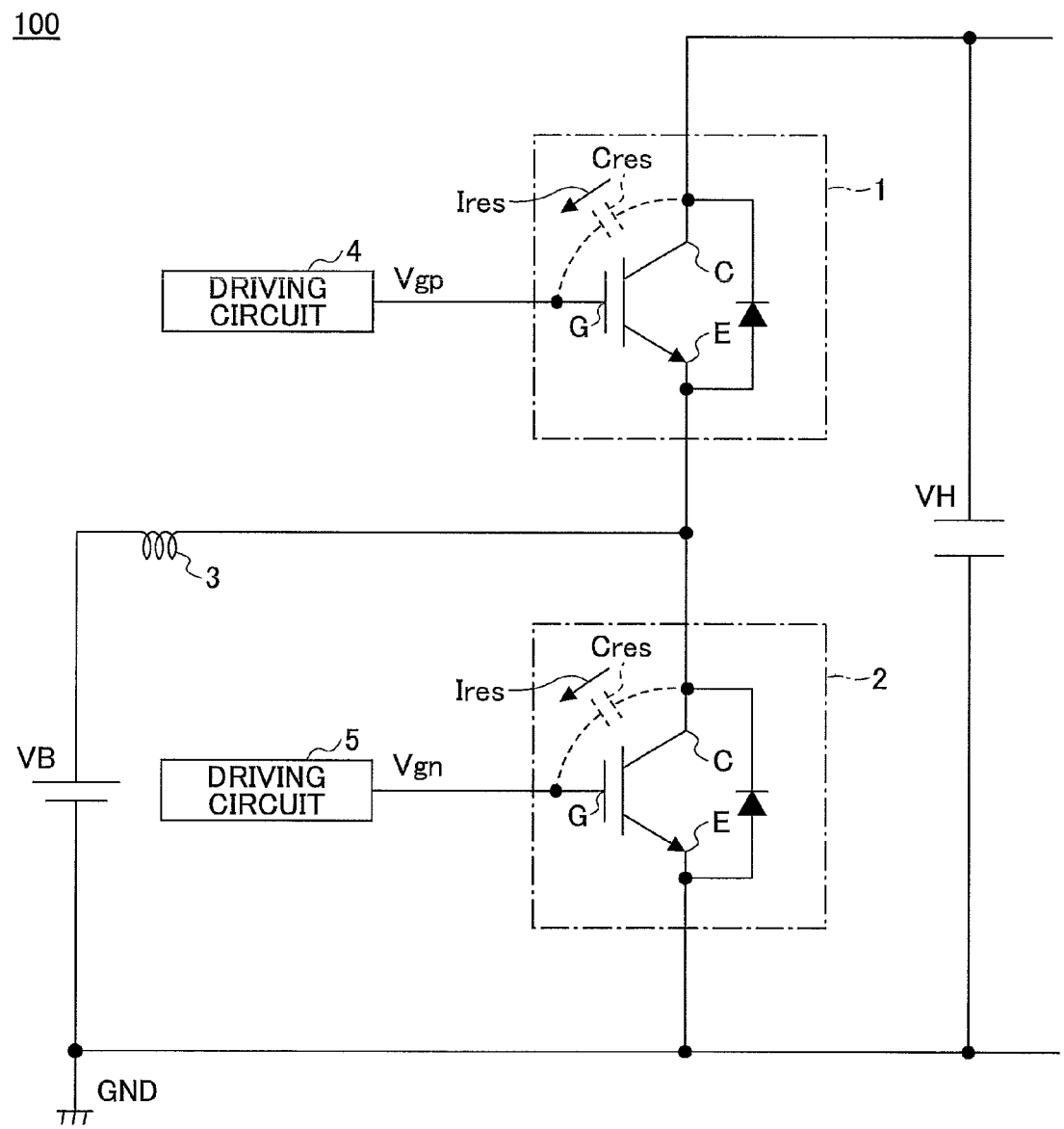
FIG. 1 is a configuration diagram illustrating one example of a step-up circuit.
Figure 2:
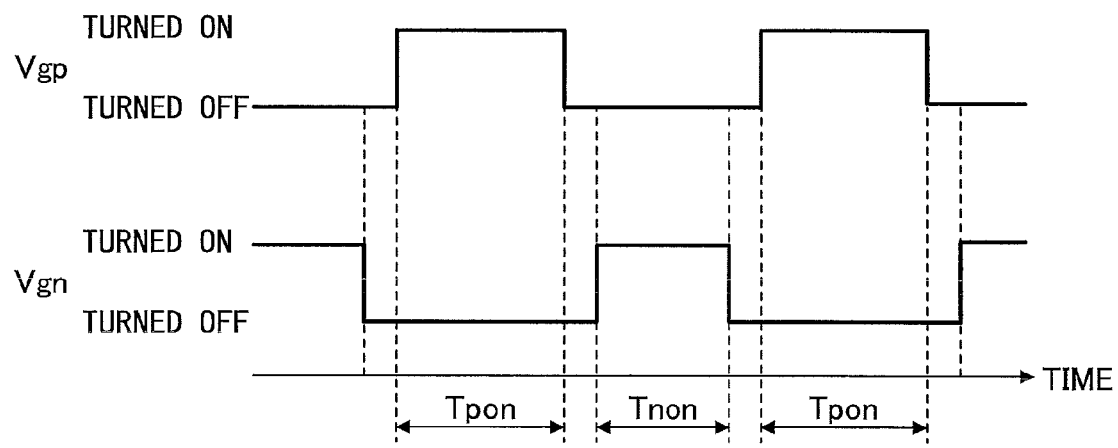
FIG. 2 is a timing chart illustrating one example of operations of the step-up circuit.

FIG. 1 is a configuration diagram illustrating one examine of a step-up circuit 100. FIG. 2 is a timing chart illustrating one example of operations of the step-up circuit 100. A gate voltage "Vgp" represents a gate voltage of a switching device 1 at a high side. The switching device 1 turns on if the gate voltage Vgp is at a high level, and turns off if the gate voltage Vgp is at a low level. A gate voltage "Vgn" represents a gate voltage of a switching device 2 at a low side. The switching device 2 turns on if the gate voltage Vgn is at a high level, and turns off if the gate voltage Vgn is at a low level.

The step-up circuit 100 is capable of stepping a low voltage VB up to a high voltage VH (a voltage having a voltage value greater than the low voltage VB) by and controlling a current flowing through an inductive load 3 through the control of driving to turn on and off the switching devices 1 and 2 as shown in FIG. 2.

However, if a short-circuit failure (i.e., a failure of being fixed to a turned-on state) occurs in the low-side switching device 2 during a turned-on period of time Tpon of the high-side switching device 1, the voltage applied between the collector C and the emitter E of the switching device 1 during the turned-on period of time Tpon sharply increases toward the high voltage VH. Therefore, a relatively great current Ires flows into the gate G via a feedback capacitance Cres between the collector C and the gate G of the switching device 1, and thus, the gate voltage Vgp increases. As a result, it may be impossible to turn off the switching device 1, although a driving circuit 4 attempts to reduce the gate voltage Vgp to a low level for protecting the switching device 1 from the overcurrent caused by the short-circuit failure of the switching device 2.

For the same reason, also when a short-circuit failure of the high-side switching device 1 occurs during a turned on period of time Tnon of the low-side switching device 2, it may be impossible to turn off the switching device 2, although a driving circuit 5 attempts to reduce the gate voltage Vgn to a low level for protecting the switching device 2 from the overcurrent caused by the short-circuit failure of the switching device 1.

Therefore, an object of the embodiments is to provide a power conversion apparatus which avoids a problematic situation of not being able to turn off another switching device due to a short-circuit failure of one switching device.

Now, the embodiments will be described.

Figure 3:
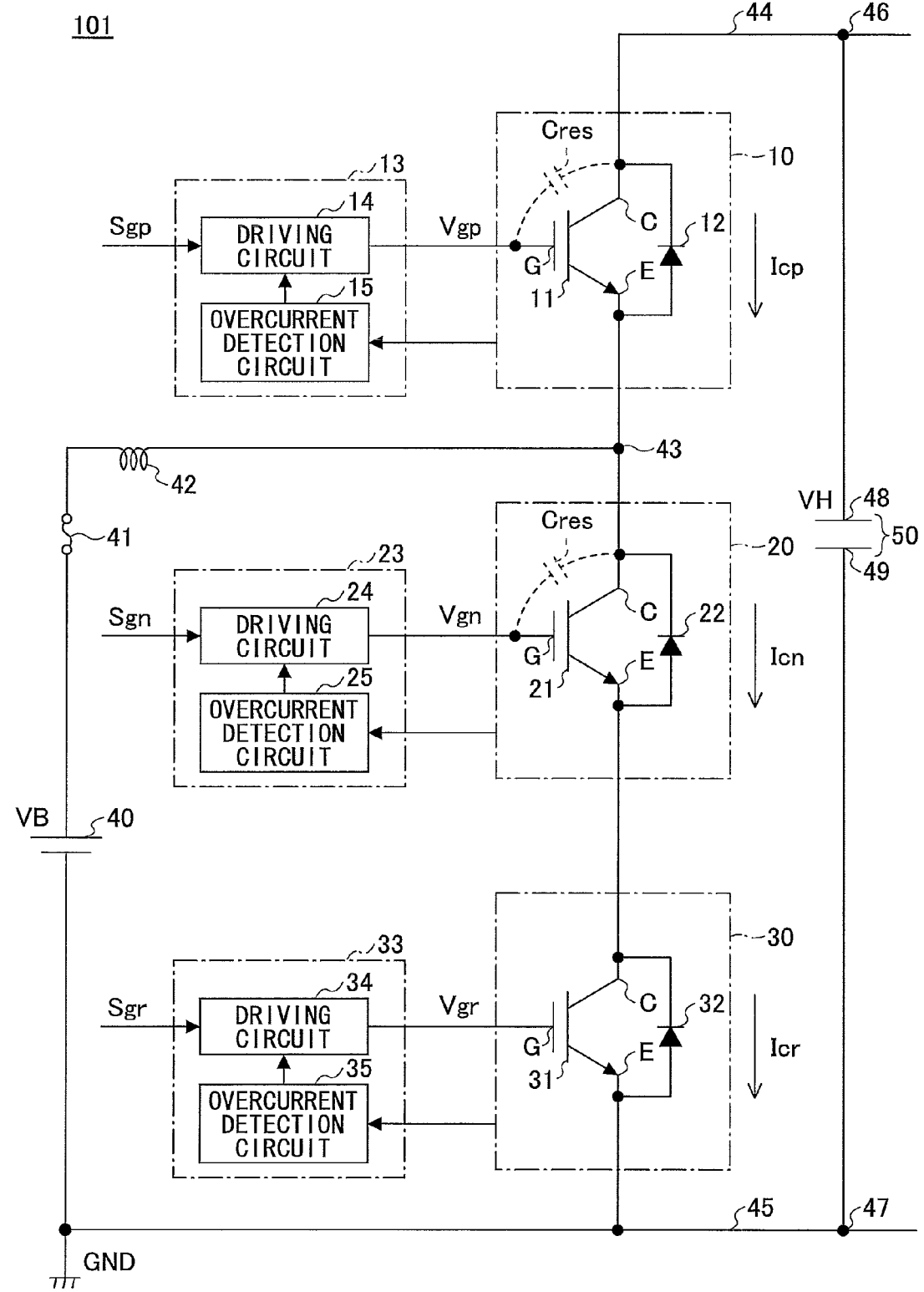
FIG. 3 is a configuration diagram illustrating one example of a step-up circuit according to one embodiment of a power conversion apparatus.

FIG. 3 is a configuration diagram illustrating one example of a step-up circuit 101 according to one embodiment of a power conversion apparatus. The step-up circuit 101 includes a first switching device 10, a second switching device 20, and a third switching device 30. The step-up circuit 101 is one example of a power conversion apparatus where, in a state where the third switching device 30 is constantly turned on, the first switching device 10 and the second switching device 20 are driven as being turned on and turned off, as shown in FIG. 2, and thus, power is converted between the input and the output. Actually, the step-up circuit 101 is a converter stepping up a low voltage VB to a high voltage VH.

The first switching device 10 is a semiconductor device connected at a high side of an intermediate node 43. The second switching device 20 is a semiconductor device connected at a low side of the intermediate node 43. The first switching device 10 and the second switching device 20 are connected in series via the intermediate node 43. The first switching device 10 may be called an upper arm while the second switching device 20 may be called a lower arm.

The intermediate node 43 is an intermediate connection part to which one end of an inductive load 42 (for example, an inductor) is connected. The other end of the load 42 is connected with a positive terminal of a power source 40 (for example, a battery). A fuse 41 may be inserted between the other end of the load 42 and the positive terminal of the power source 40 in series.

The third switching device 30 is a semiconductor device connected in series with the second switching device 20 at a low side of the second switching device 20 on the opposite side of the intermediate node 43. The third switching device 30 is inserted, for example, between the low-electric-potential-side terminal of the second switching device 20 and a current path 45 at a ground electric potential (GND).

The first switching device 10 includes a transistor 11 and a diode 12. The transistor 11 is an insulated-gate-type voltage controlled semiconductor device, and is, for example, an Insulated Gate Bipolar Transistor (IGBT) having a gate G, a collector C, and an emitter E. The diode 12 is a rectifier device connected with the transistor 11 in parallel. The diode 12 has an anode connected to the emitter E of the transistor 11 and a cathode connected to the collector C of the transistor 11. The gate G denotes a gate electrode, the collector C denotes a high-electric-potential-side electrode, and the emitter E denotes a low-electric-potential-side electrode.

The second switching device 20 includes a transistor 21 and a diode 22. The third switching device 30 includes a transistor 31 and a diode 32. As shown in FIG. 3, the second switching device 20 and the third switching device 30 have the same configuration as that of the first switching device 10. Therefore, description of the configurations of the second switching device 20 and the third switching device 30 will be omitted by herewith referring to the above description of the first switching device 10.

Note that turning on the first switching device 10 means turning on the transistor 11. Turning on the second switching device 20 means turning on the transistor 21. Turning on the third switching device 30 means turning on the transistor 31. In the same way, turning off the first switching device 10 means turning off the transistor 11. Turning off the second switching device 20 means turning off the transistor 21. Turning off the third switching device 30 means turning off the transistor 31.

The step-up circuit 101 further includes a first driving part 13 driving the first switching device 10, a second driving part 23 driving the second switching device 20, and a third driving part 33 driving the third switching device 30.

The first driving part 13 at a high side includes a driving circuit 14 and an overcurrent detection circuit 15. The driving circuit 14 controls the gate voltage Vgp of the first switching device 10 at the same high side according to a driving signal Sgp (for example, a pulse-width modulated signal) supplied from a host control apparatus of the first driving part 13, and turns on and off the first switching device 10. The overcurrent detection circuit 15 detects an overcurrent flowing between the collector C and the emitter E of the first switching device 10 at the same high side. If the overcurrent flowing through the first switching device 10 is detected by the overcurrent detection circuit 15, the driving circuit 14 sets the level of the gate voltage Vgp to such a low level as to turn off the first switching device 10 without regard to the driving signal Sgp.

The second driving part 23 at a low side includes a driving circuit 24 and an overcurrent detection circuit 25. The driving circuit 14 controls the gate voltage Vgn of the second switching device 20 at the same low side according to a driving signal Sgn (for example, a pulse-width modulated signal) supplied from a host control apparatus of the second driving part 23, and turns on and off the second switching device 10. The overcurrent detection circuit 25 detects an overcurrent flowing between the collector C and the emitter E of the second switching device 20 at the same low side. If the overcurrent flowing through the second switching device 20 is detected by the overcurrent detection circuit 25, the driving circuit 24 sets the level of the gate voltage Vgn to such a low level as to turn off the second switching device 20 without regard to the driving signal Sgn.

The third driving part 33 includes a driving circuit 34 and an overcurrent detection circuit 35. The driving circuit 34 controls the gate voltage Vgr of the third switching device 30 according to a driving signal Sgr (for example, a pulse-width modulated signal) supplied from a host control apparatus of the third driving part 33, and turns on and off the third switching device 30. The overcurrent detection circuit 35 detects an overcurrent flowing between the collector C and the emitter E of the third switching device 30. If the overcurrent flowing through the third switching device 30 is detected by the overcurrent detection circuit 35, the driving circuit 34 sets the level of the gate voltage Vgr to such a low level as to turn off the third switching device 30 without regard to the driving signal Sgr.

However, the driving signal Sgr keeping the third switching device 30 in a turned on state constantly is input to the driving circuit 34 when the first switching device 10 and the second switching device 20 are turned on and turned off as shown in FIG. 2. The driving circuit 34 keeps the third switching device 30 in a turned on state constantly according to the driving signal Sgr keeping the third switching device 30 in a turned on state constantly.

The step-up circuit 101 controls the current flowing through the inductive load 42 by driving to turn on and turn off the first switching device 10 and the second switching device 20 as shown in FIG. 2 in a state where the third switching device 30 is constantly turned on, and thus, it is possible to step up the low voltage VB to the high voltage VH. Therefore, if the step-up circuit 101 is mounted, for example, in a vehicle, it is possible to step up the low voltage VB of the power source 40 to the high voltage VH necessary for the vehicle traveling.

Power at the high voltage VH is used to charge, for example, a secondary battery 50 such as a capacitor. The secondary battery 50 is connected in parallel with the series circuit where the first switching device 10, the second switching device 20, and the third switching device 30 are connected in series. A terminal 48 at a high-electric-potential side of the secondary battery 50 is connected at a connection point 46 to a current path 44 at a power supply electric potential. A terminal 49 at a low-electric-potential side of the secondary battery 50 is connected at a connection point 47 to the current path 45 at the ground electric potential.

If it is detected that an overcurrent due to a short-circuit failure of one of the first switching device 10 and the second switching device 20 flows through the other of these two switching devices 10 and 20 in a state where the third switching device 30 is constantly turned on, the step-up circuit 101 turns off the other switching device and the third switching device 30. Thereby, even if one of the switching devices 10 and 20 has a short-circuit failure, the voltage applied to the other of the switching devices 10 and 20 is reduced according to voltage sharing acquired from the serial connection of the first switching device 10, the second switching device 20, and the third switching device 30. Thus, it is possible to reduce a current flowing into the gate G via the feedback capacitance Cres of the other switching device at the time of overcurrent generation. Thus, it is possible to control the gate voltage of the other switching device from increasing. Therefore, it is possible to avoid such a situation that the other switching device cannot be turned off. Thus, it is possible to prevent, for example, the other switching device from having a short-circuit failure in a chain reaction manner.

For example, if a short-circuit failure of the second switching device 20 occurs during a turned-on period of time Tpon of the first switching device 10 (see FIG. 2), an overcurrent (hereinafter, referred to as an "overcurrent Icno") due to the short-circuit failure of the second switching device 20 flows. The overcurrent Icno is a current passing through the first switching device 10, the second switching device 20, and the third switching device 30. Therefore, the overcurrent Icno flowing through the first switching device 10 is detected by the overcurrent detection circuit 15, and the overcurrent Icno flowing through the third switching device 30 is detected by the overcurrent detection circuit 35. As a result of the overcurrent Icno being thus detected by the overcurrent detection circuit 15, the driving circuit 14 turns off the first switching device 10. At the same time, as a result of the overcurrent Icno being thus detected by the overcurrent detection circuit 35, the driving circuit 34 turns off the third switching device 30.

When the first switching device 10 and the third switching device 30 thus begin being turned off, the peak value of the overcurrent Icno can be reduced due to the resistance component of the first switching device 10 and the resistance component of the third switching device 30. Also, the high voltage VH is divided by the resistance component of the first switching device 10 and the resistance component of the third switching device 30. Thus, the voltage applied between the collector C and the emitter E of the first switching device 10 and also the voltage applied between the collector C and the emitter E of the third switching device 30 can be reduced. Therefore, it is possible to control the gate voltage Vgp of the first switching device 10 from increasing and the gate voltage Vgr of the third switching device 30 from increasing. Thus, the driving circuit 14 can complete turning off the first switching device 10, and the driving circuit 34 can complete turning off the third switching device 30.

As a result, it is possible to avoid a short-circuit failure of the first switching device 10 which may otherwise occur due to the overcurrent Icno. Also, because the third switching device 30 is turned off even if the second switching device 20 has a short-circuit failure, it is possible to prevent the fuse 41 from being blown which may otherwise occur due an overcurrent flowing from the power source 40. As a result of being thus able to prevent the fuse 41 from being blown, the power source 40 is capable of continuously supplying power to another load connected between the fuse 41 and the inductive load 42 (for example, a computer or so), for example, and thus, it is possible to improve the vehicle's declining traveling performance.

In the same way, if a short-circuit failure of the first switching device 10 occurs during a turned-on period of time Tnon of the second switching device 20 (see FIG. 2), an overcurrent (hereinafter, referred to as an "overcurrent Icpo") due to the short-circuit failure of the first switching device 10 flows. The overcurrent Icpo is a current passing through the first switching device 10, the second switching device 20, and the third switching device 30. Therefore, the overcurrent Icpo flowing through the second switching device 20 is detected by the overcurrent detection circuit 25, and the overcurrent Icnp flowing through the third switching device 30 is detected by the overcurrent detection circuit 35. As a result of the overcurrent Icpo being detected by the overcurrent detection circuit 25, the driving circuit 24 turns off the second switching device 20. At the same time, as a result of the overcurrent Icpo being detected by the overcurrent detection circuit 35, the driving circuit 34 turns off the third switching device 30.

When the second switching device 20 and the third switching device 30 thus begin being turned off, the peak value of the overcurrent Icpo can be reduced due to the resistance component of the second switching device 20 and the resistance component of the third switching device 30. Also, the high voltage VH is divided by the resistance component of the second switching device 20 and the resistance component of the third switching device 30. Therefore, the voltage applied between the collector C and the emitter E of the second switching device 20 and also the voltage applied between the collector C and the emitter E of the third switching device 30 can be reduced. Therefore, it is possible to control the gate voltage Vgn of the second switching device 20 from increasing and the gate voltage Vgr of the third switching device 30 from increasing. Thus, the driving circuit 24 can complete turning off the second switching device 20, and the driving circuit 34 can complete turning off the third switching device 30.

As a result, it is possible to avoid a short-circuit failure of the second switching device 20 which may otherwise occur due to the overcurrent Icpo. Also, because the second and third switching devices 20 and 30 are turned off even if the first switching device 10 has a short-circuit failure, it is possible to prevent the fuse 41 from being blown which may otherwise occur due an overcurrent flowing from the power source 40.

Note that Icp denotes the current flowing between the collector C and the emitter E of the first switching device 10, Icn denotes the current flowing between the collector C and the emitter E of the second switching device 20, and Icr denotes the current flowing between the collector C and the emitter E of the third switching device 30.

The first driving part 13 has the driving circuit 14 turning off the first switching device 10 if the overcurrent detection circuit 15 detects that a current greater than or equal to a first threshold Ith1 flows through the first switching device 10. The first threshold Ith1 is one example of a threshold for enabling a determination as to whether the overcurrent due to a short-circuit failure of the second switching device 20 flows through the first switching device 10.

The second driving part 23 has the driving circuit 24 turning off the second switching device 20 if the overcurrent detection circuit 25 detects that a current greater than or equal to a second threshold Ith2 flows through the second switching device 20. The second threshold Ith2 is one example of a threshold for enabling a determination as to whether the overcurrent due to a short-circuit failure of the first switching device 10 flows through the second switching device 20.

The third driving part 33 has the driving circuit 34 turning off the third switching device 30 if the overcurrent detection circuit 35 detects that a current greater than or equal to a third threshold Ith3 flows through the third switching device 30. The third threshold Ith3 is one example of a threshold for enabling a determination as to whether the overcurrent due to a short-circuit failure of one of the first and second switching devices 10 and 20 flows through the third switching device 30.

The third threshold Ith3 is greater than or equal to the first threshold Ith1 and is greater than or equal to the second threshold Ith2. In other words, the third threshold Ith3 can be the same as the first threshold Ith1 and the same as the second threshold Ith2. Also, the third threshold Ith3 can be the same as one of the first threshold Ith1 and the second threshold Ith2, and can be greater than the other of the first threshold Ith1 and the second threshold Ith2. The first threshold Ith1 and the second threshold Ith2 can be the same as or different from one another.

Figure 4:
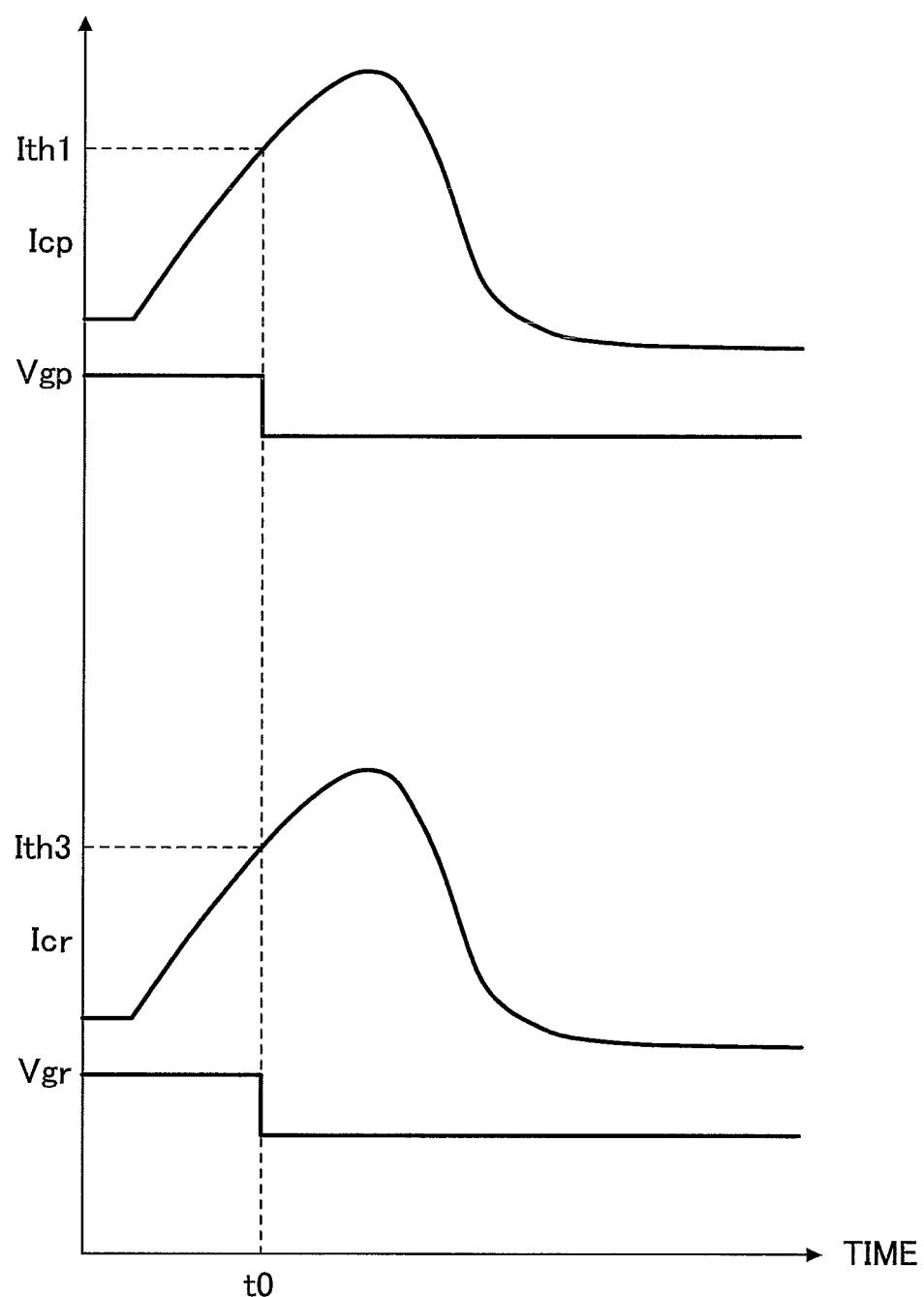
FIG. 4 is a timing chart illustrating one example of operations of the step-up circuit according to the embodiment of the power conversion apparatus.

FIG. 4 is a timing chart illustrating one example of operations of the step-up circuit 101 when a short-circuit failure of the second switching device 20 occurs during a turned-on period of time Tpon of the first switching device 10 (see FIG. 2). The currents "Icp" and "Icr" flowing when a short-circuit failure of the second switching device 20 occurs during a turned-on period of time Tpon of the first switching device 10 are substantially the same as the overcurrent "Icno" described above.

The driving circuit 14 of the first driving part 13 turns off the first switching device 10 by switching the gate voltage Vgp from the high level to the low level at a timing t0 if the overcurrent detection circuit 15 detects that a current Icp greater than or equal to the first threshold Ith1 flows through the first switching device 10. Thus, the current Icp becomes less than the first threshold Ith1 after overshooting.

In the same way, the driving circuit 34 of the third driving part 33 turns off the third switching device 30 by switching the gate voltage Vgr from a high level to a low level at the timing t0 if the overcurrent detection circuit 35 detects that a current Icr greater than or equal to the third threshold Ith3 flows through the third switching device 30. Thus, the current Icr becomes less than the third threshold Ith3 after overshooting.

Thus, the first threshold Ith1 for the overcurrent detection circuit 15 to detect the overcurrent and the third threshold Ith3 for the overcurrent detection circuit 35 to detect the overcurrent are set to be the same current value. Thereby, a timing of beginning turning off the first switching device 10 by the driving circuit 14 can be made the same as a timing of beginning turning off the third switching device 30 by the driving circuit 34. Thus, it is possible to prevent one of the first switching device 10 and the third switching device 30 from being not easily turned off which may otherwise occur due to the energy of the overcurrent Icno being consumed by the one of the first switching device 10 and the third switching device 30 disproportionally.

Note that it is also possible that the driving circuit 24 of the second driving part 23 turns off the second switching device 20 by switching the gate voltage Vgn from the high level to the low level at the timing to, if the overcurrent detection circuit 25 detects that a current Icn greater than or equal to the second threshold Ith2 flows through the second switching device 20. That is, also the second threshold Ith2 for the overcurrent detection circuit 25 of the second driving part 23 to detect the overcurrent is set to be the same current value as the third threshold Ith3.

Thereby, a timing of beginning turning off the second switching device 20 by the driving circuit 24 can be made the same as a timing of beginning turning off the third switching device 30 by the driving circuit 34. Thus, it is possible to prevent one of the second switching device 20 and the third switching device 30 from being not easily turned off which may otherwise occur due to the energy of the overcurrent Icpo being consumed by the one of the second switching device 20 and the third switching device 30 disproportionally.

Figure 5:
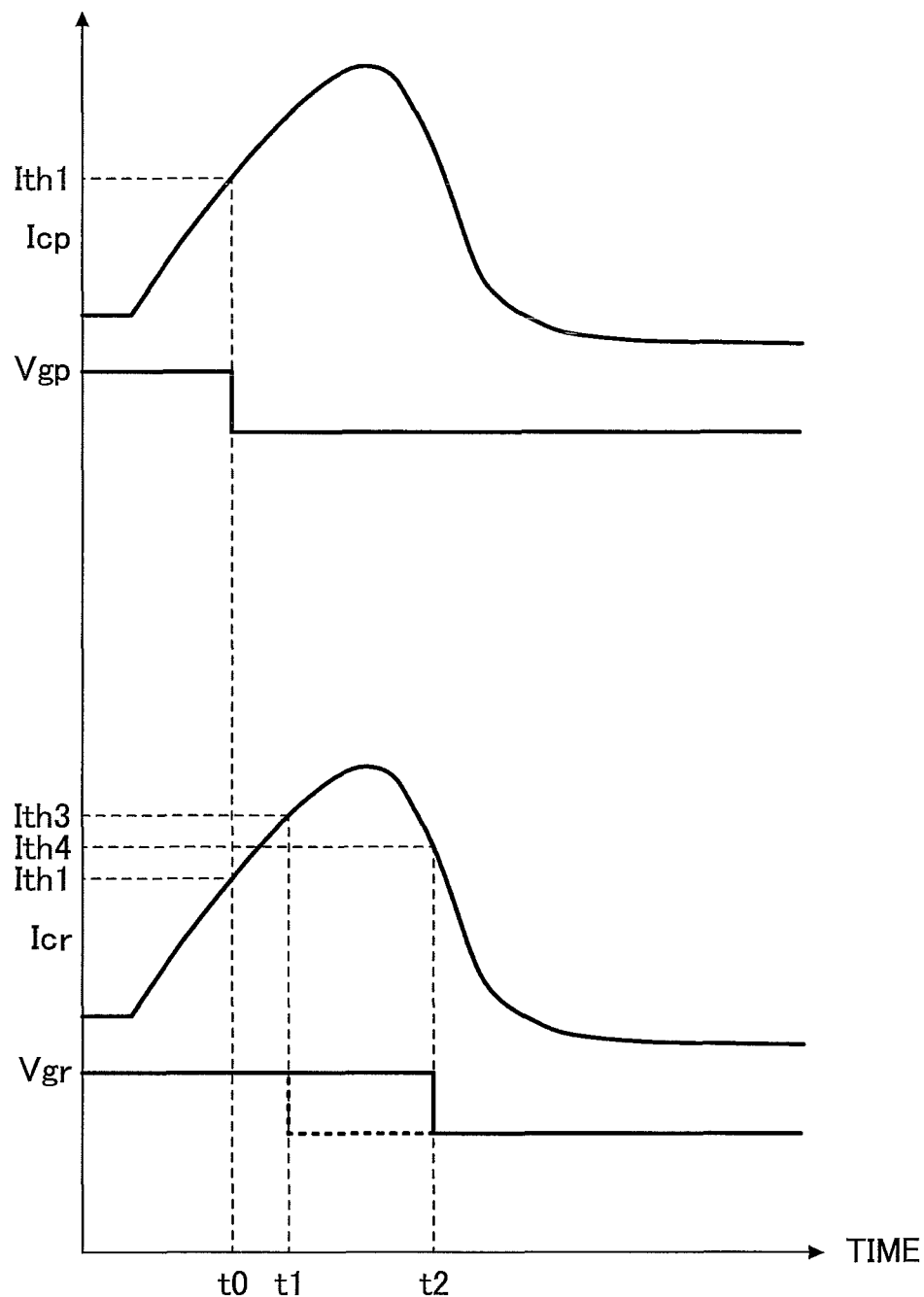
FIG. 5 is a timing chart illustrating another example of operations of the step-up circuit according to the embodiment of the power conversion apparatus.

FIG. 5 is a timing chart illustrating another example of operations of the step-up circuit 101 when a short-circuit failure of the second switching device 20 occurs during a turned-on period of time Tpon of the first switching device 10 (see FIG. 2).

The driving circuit 14 of the first driving part 13 turns off the first switching device 10 by switching the gate voltage Vgp from the high level to the low level at a timing t0 if the overcurrent detection circuit 15 detects that a current Icp greater than or equal to the first threshold Ith1 flows through the first switching device 10. Thus, the current Icp becomes less than the first threshold Ith1 after overshooting.

On the other hand, the driving circuit 34 of the third driving part 33 turns off the third switching device 30 by switching the gate voltage Vgr from the high level to the low level at a timing t1 if the overcurrent detection circuit 35 detects that a current Icr greater than or equal to the third threshold Ith3 flows through the third switching device 30. The third threshold Ith3 is greater than the first threshold Ith1.

That is, it is possible to set the third threshold Ith3 to a current value greater than the first threshold Ith1 if the overcurrent flowing through the first switching device 10 and the third switching device 30 does not rapidly begin falling and exceeds the first threshold Ith1 even after the first switching device 10 begins turning off at the timing to.

When the third threshold Ith3 for the overcurrent detection circuit 35 to detect the overcurrent is thus set greater than the first threshold Ith1 for the overcurrent detection circuit 15 to detect the overcurrent, the timing t1 of beginning turning off the third switching device 30 by the driving circuit 34 is delayed from the timing t0 of beginning turning off the first switching device 10 by the driving circuit 14.

As a result of the turning-off timing t1 of the third switching device 30 being thus delayed from the turning-off timing t0 of the first switching device 10, the voltage between the collector C and the emitter E of the first switching device 10 which begins turning off earlier sharply increases. Thus, the gate voltage of the first switching device 10 increases, and the loss in the first switching device 10 increases. On the other hand, the voltage shared by the third switching device 30 decreases as a result of the first switching device 10 beginning turning off earlier, thereby the voltage between the collector C and the emitter E of the third switching device 30 reduces, and the loss of the third switching device 30 decreases.

However, if the first switching device 10 can be turned off although the gate voltage of the first switching device 10 thus increases, the turning-off timing t1 of the third switching device 30 can be delayed from the turning-off timing t0 of the first switching device 10 as long as the loss in the first switching device 10 does not exceed an allowable range. That is, the third threshold Ith3 can be set to a current value greater than the first threshold Ith1.

Further, the first switching device 10 can be turned off without turning off the third switching device 30, if an overcurrent Icno is relatively small (i.e., if the peak current value of the overcurrent Icno is greater than the first threshold Ith1 and less than the third threshold Ith3) when the third threshold Ith3 is thus greater than the first threshold Ith1. That is, if the overcurrent Icno has such an amount that the first switching device 10 can be turned off while the third switching device 30 cannot be turned off, it is possible to avoid a short-circuit failure of the first switching device 10 while leaving the third switching device in the turned on state.

In the same way, if the second switching device 20 can be turned off although the gate voltage of the second switching device 20 increases, the turning-off timing t1 of the third switching device 30 can be delayed from the turning-off timing t0 of the second switching device 20 as long as the loss in the second switching device 20 does not exceed an allowable range. That is, the third threshold Ith3 can be set to a current value greater than the second threshold Ith2.

In the same way, the second switching device 20 can be turned off without turning off the third switching device 30, if an overcurrent Icpo is relatively small (i.e., if the peak current value of the overcurrent Icpo is greater than the second threshold Ith2 and less than the third threshold Ith3) when the third threshold Ith3 is thus greater than the second threshold Ith2. That is, if the overcurrent Icpo has such an amount that the second switching device 20 can be turned off while the third switching device 30 cannot be turned off, it is possible to avoid a short-circuit failure of the second switching device 20 while leaving the third switching device in the turned on state.

It is also possible that the driving circuit 34 of the third driving part 33 turns off the third switching device 30 by switching the gate voltage Vgr from the high level to the low level at a timing t2 if the overcurrent detection circuit 35 detects that the current Icr less than or equal to a fourth threshold Ith4 flows through the third switching device 30 after the current Icr greater than or equal to the third threshold Ith3 flows through the third switching device 30. The fourth threshold Ith4 is less than the third threshold Ith3.

Thereby, it is possible to prevent the third switching device 30 from being erroneously turned off under a condition where, for example, it is not possible to determine whether the first switching device 10 or the second switching device 20 is turned off due to detection of an overcurrent. The third driving part 33 can estimate that the first switching device 10 or the second switching device 20 is turned off due detection of an overcurrent if the overcurrent detection circuit 35 detects that the current Icr decreases to be less than or equal the fourth threshold Ith4 after the current Icr increases to be greater than or equal to the third threshold Ith3.

It is also possible that the driving circuit 34 of the third driving part 33 turns off the third switching device 30 by switching the gate voltage Vgr from the high level to the low level, if the overcurrent detection circuit 35 detects that the increasing rate of the current Icr is turned to be negative after the current Icr greater than or equal to the third threshold Ith3 flows through the third switching device 30. Thus, in the same way as that mentioned above, it is possible to prevent the third switching device 30 from being erroneously turned off under a condition where, for example, it is not possible to determine whether the first switching device 10 or the second switching device 20 is turned off due to detection of an overcurrent.

It is preferable that the turning off speed of the third switching device 30 is faster than the turning off speed of the first switching device 10 if the third threshold Ith3 is greater than the first threshold Ith1, and is faster than the turning off speed of the second switching device 20 if the third threshold Ith3 is greater than the second threshold Ith2. Thereby, the delay time between the timing t0 of beginning turning off the first switching device 10 or beginning turning off the second switching device 20 and the timing t1 of beginning turning off the third switching device 30 is reduced. Also, the delay time between the timing t0 of beginning turning off the first switching device 10 or beginning turning off the second switching device 20 and the timing t2 of beginning turning off the third switching device 30 is reduced. Thus, it is possible to prevent any one of the switching devices from being not easily turned off which may otherwise occur due to the energy of the overcurrent is consumed by the one of the switching devices disproportionally.

For example, the resistance value of the gate resistance of the third switching device 30 is made less than the resistance values of the gate resistances of the first switching device 10 and the second switching device 20. Thus, the turning off speed of the third switching device 30 can be faster than the turning off speeds of the first switching device 10 and the second switching device 20.

Figure 6:
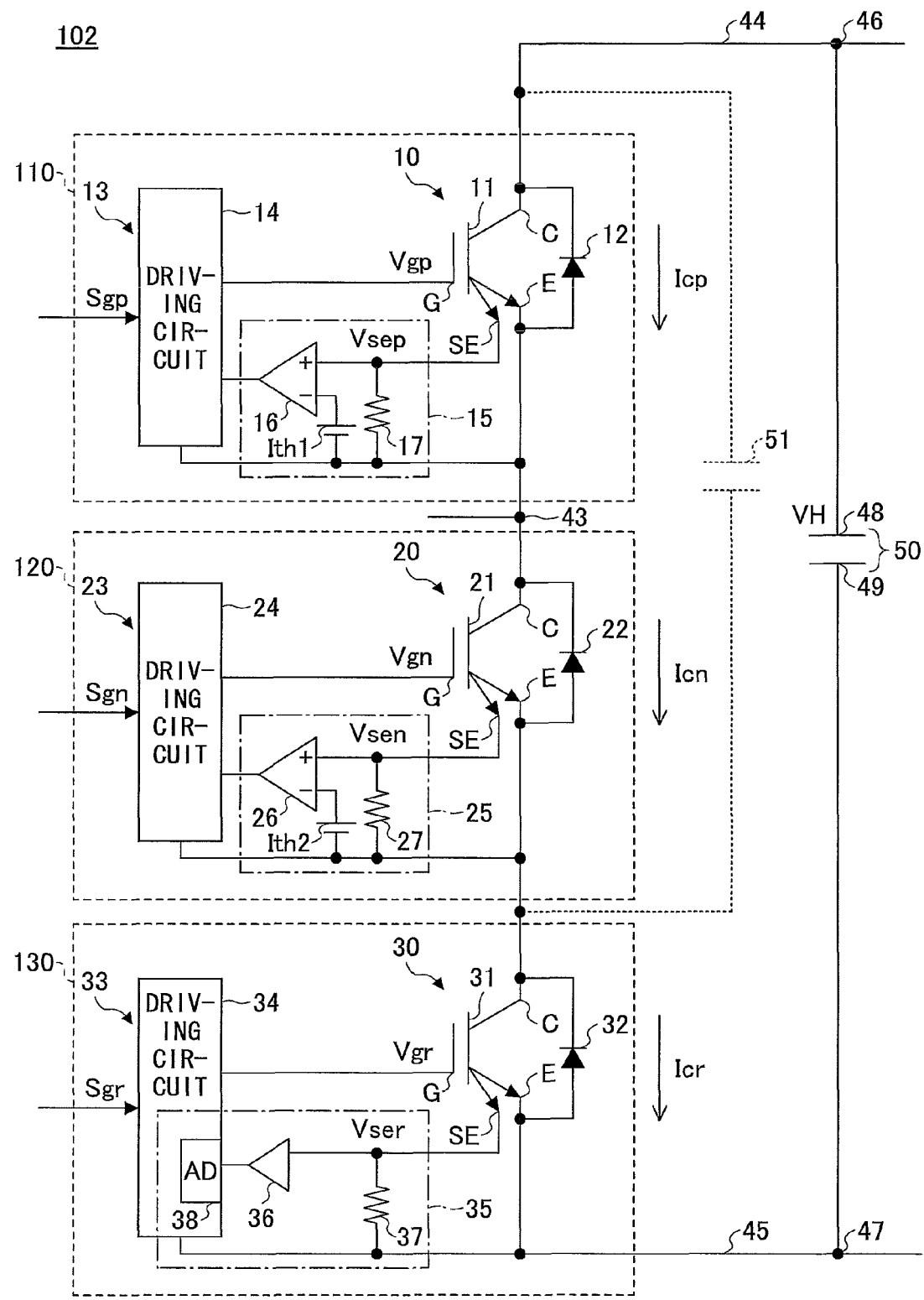
FIG. 6 is a configuration diagram illustrating one example of the step-up circuit in detail.

FIG. 6 illustrates one example of a step-up circuit 102. The step-up circuit 102 is an actual example of the step-up circuit 101 of FIG. 3. Description of the same configuration as the configuration of FIG. 3 will be omitted by herewith referring to the above description of the configuration of FIG. 3.

The step-up circuit 102 includes an upper arm circuit 110, a lower arm circuit 120, and a semiconductor relay 130. The upper arm circuit 110 includes a first switching device 10, and a first driving part 13. The lower arm circuit 120 includes a second switching device 20, and a second driving part 23. The semiconductor relay 130 includes a third switching device 30, and a third driving part 33.

The first switching device 10 has a sense emitter SE. The sense emitter SE is a sense electrode that outputs, according to the current Icp, a sense current smaller than the current Icp. As a result of the sense current flowing through a resistor 17, a sense voltage Vsep corresponding to the magnitude of the current Icp is generated. An overcurrent detection circuit 15 has a comparator 16 and the resistor 17. The overcurrent detection circuit 15 is capable of detecting that the current Icp increases to be greater than or equal to the first threshold Ith1 when the comparator 16 detects the sense voltage Vsep greater than a reference voltage that defines the first threshold Ith1.

In the same way, the second switching device 20 has a sense emitter SE. The sense emitter SE is a sense electrode that outputs, according to the current Icn, a sense current smaller than the current Icn. As a result of the sense current flowing through a resistor 27, a sense voltage Vsen corresponding to the magnitude of the current Icn is generated. An overcurrent detection circuit 25 has a comparator 26 and the resistor 27. The overcurrent detection circuit 25 is capable of detecting that the current Icn increases to be greater than or equal to the second threshold Ith2 when the comparator 16 detects the sense voltage Vsen greater than a reference voltage that defines the second threshold Ith2.

The third switching device 30 has a sense emitter SE. The sense emitter SE is a sense electrode that outputs, according to the current Icr, a sense current smaller than the current Icr. As a result of the sense current flowing through a resistor 37, a sense voltage Vser corresponding to the magnitude of the current Icr is generated. An overcurrent detection circuit 35 includes the resistor 37 generating the sense voltage Vser, an amplifier 36 to which the sense voltage Vser is input, and an Analog-to-Digital (AD) converter 38 to which the analog output of the amplifier 36 is input. Thus, the overcurrent detection circuit 35 is capable of detecting that the current Icr greater than or equal to the third threshold Ith3 flows through the third switching device 30 based on the conversion result of the AD converter 38. Alternatively, the overcurrent detection circuit 35 is capable of detecting that the current Icr less than or equal to the fourth threshold Ith4 flows through the third switching device 30 after the current Icr greater than or equal to the third threshold Ith3 flows through the third switching device 30 based on the conversion result of the AD converter 38.

Figure 7:
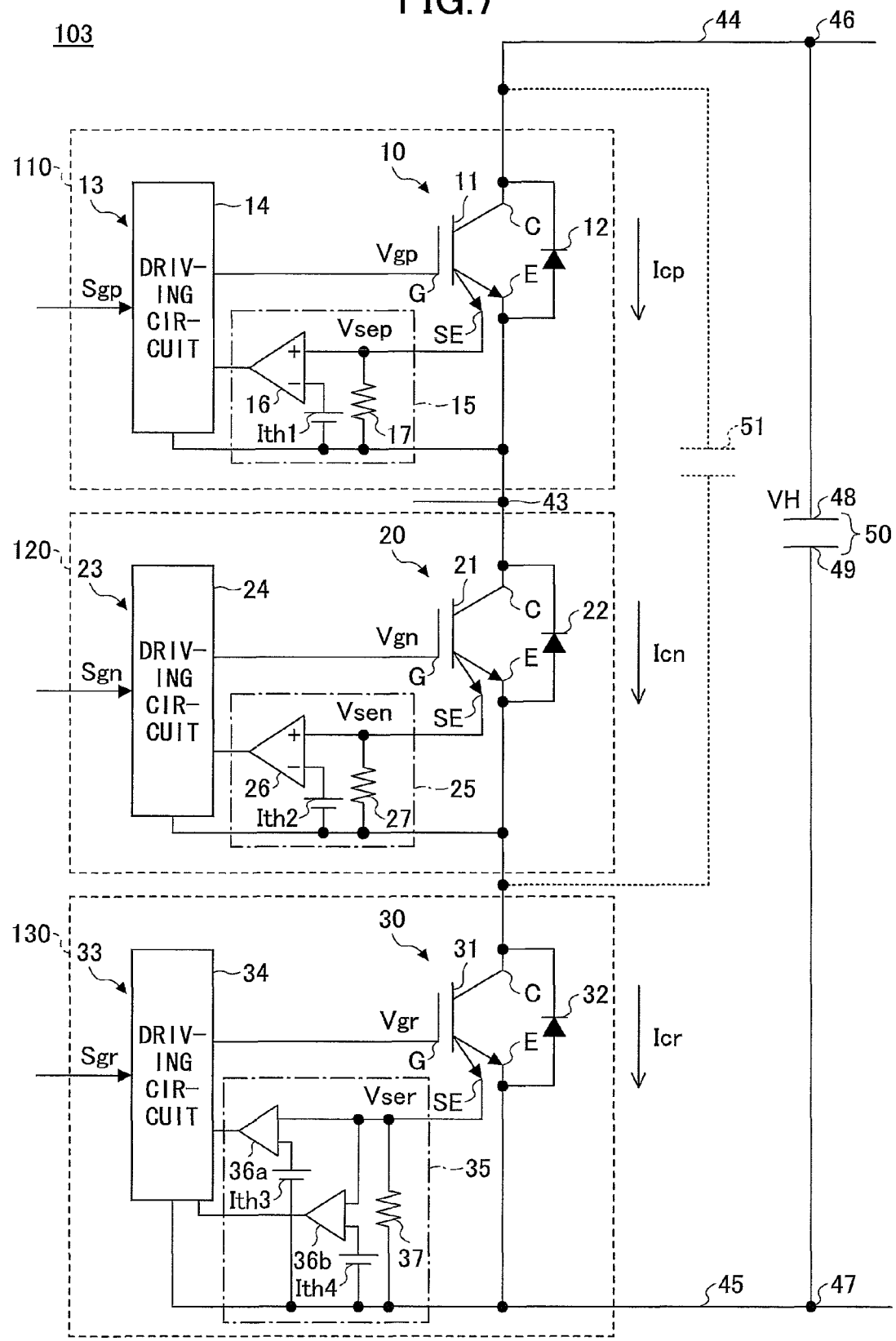
FIG. 7 is a configuration diagram illustrating another example of the step-up circuit in detail.

FIG. 7 illustrates one example of a step-up circuit 103. The step-up circuit 103 is another actual example of the step-up circuit 101 of FIG. 3. Description of the same configuration as the configuration of FIGS. 3 and 6 will be omitted by herewith referring to the above description of the configuration of FIGS. 3 and 6.

An overcurrent detection circuit 35 has a resistor 37 generating a sense voltage Vser, and comparators 36a and 36b to which the sense voltage Vser is input. The overcurrent detection circuit 35 is capable of detecting that the current Icr increases to be greater than or equal to the third threshold Ith3 when the comparator 36a detects the sense voltage Vser greater than a reference voltage that defines the third threshold Ith3. Also, the overcurrent detection circuit 35 is capable of detecting that the current Icr decreases to be less than or equal to the fourth threshold Ith4 when the comparator 36b detects the sense voltage Vser less than a reference voltage that defines the fourth threshold Ith4.

Thus, the power conversion apparatuses have been described in embodiments. However, the present invention is not limited to these embodiments. Various modifications and/or implements such as combinations with part of or all of another embodiment(s), a replacement(s) with part of another embodiment(s), and so forth, can be made within the scope of the present invention.

For example, the power conversion apparatuses are not limited to converters stepping DC power up or down. For example, the power conversion apparatuses can be inverters converting power between DC power and AC power. For example, the power conversion apparatus used as an inverter driving a three-phase motor has, in parallel, three (the same number as that of the phases of the motor) series circuits each including the first switching device 10, the second switching device 20, and the third switching device 30 connected in series. In this case, the inductive load 42 connected to the intermediate nodes 43 is the motor.

Also, for example, in FIG. 3, it is also possible that the third switching device 30 is connected in series with the first switching device 10 at a high side opposite to the intermediate node 43 with respect to the first switching device 10. In this case, the third switching device 30 is connected in series between the high-electric-potential side terminal of the first switching device 10 and the current path 44 at the power source electric potential.

Also, the third switching device 30 can be inserted and connected in series between the second switching device 20 and the intermediate node 43, or can be inserted and connected in series between the first switching device 10 and the intermediate node 43.

Also, the number of the third switching devices 30 is not limited to one, and a plurality of the third switching devices 30 can be included. It is possible that one or a plurality of the third switching devices 30 are connected in series with at least one of the first switching device 10 and the second switching device 20.

Also, the switching devices are not limited to IGBTs. For example, the switching devices can be n-channel Metal Oxide Semiconductor Field Effect Transistors (MOSFETs), or so. In a case of MOSFETs, the "collectors" are read as "drains", and the "emitters" are read as "sources", in the above description. Also, a capacitor 51 (see FIGS. 6 and 7) can be connected in parallel to the series circuit of the first switching device 10 and the second switching device 20.

According to the embodiments, due to the voltage sharing in the series circuit of the first switching device, the second switching device, and the third switching device, the voltage applied to the other one of the first switching device and the second switching device can be reduced even if one of the first switching device and the second switching device has a short-circuit failure. Thus, it is possible to avoid such a situation that it is not possible to turn off the other one of the first switching device and the second switching device, also because an increase in the gate voltage of the other one of the first switching device and the second switching device can be reduced.

The present application is based on and claims the benefit of priority of Japanese Priority Application No. 2015-025778, filed on Feb. 12, 2015, the entire contents of which are hereby incorporated herein by reference.

What is claimed is:

1. A power conversion apparatus comprising:
   a first switching device at a high-voltage side of the apparatus;
   a second switching device at a low-voltage side of the apparatus, the first switching device and the second switching device being connected in series;
   a third switching device connected in series with the first switching device or the second switching device,
      wherein upon detection of an overcurrent flowing through one of the first switching device and the second switching device due to a short-circuit failure of the other of the first switching device and the second switching device, the power conversion apparatus turns off the one of the first switching device and the second switching device through which the overcurrent flows, and turns off the third switching device;
   a first driving part turning off the first switching device upon detection of a current greater than or equal to a first threshold flowing through the first switching device;
   a second driving part turning off the second switching device upon detection of a current greater than or equal to a second threshold flowing through the second switching device; and
   a third driving part turning off the third switching device upon detection of a current greater than or equal to a third threshold flowing through the third switching device, wherein
      the third threshold is greater than or equal to the first threshold and is greater than or equal to the second threshold, and
      a turning off speed of the third switching device is faster than a turning off speed of the first switching device if the third threshold is greater than the first threshold, and the turning off speed of the third switching device is faster than a turning off speed of the second switching device if the third threshold is greater than the second threshold.

2. The power conversion apparatus as claimed in claim 1, wherein the first threshold has the same value as the second threshold.

3. The power conversion apparatus as claimed in claim 1, wherein the third driving part turns off the third switching device upon detection of a current less than or equal to a fourth threshold, which is less than the third threshold, flowing through the third switching device after detection of a current greater than or equal to the third threshold flowing through the third switching device.

4. The power conversion apparatus as claimed in claim 2, wherein the third driving part turns off the third switching device upon detection of a current less than or equal to a fourth threshold, which is less than the third threshold, flowing through the third switching device after detection of a current greater than or equal to the third threshold flowing through the third switching device.

5. The power conversion apparatus as claimed in claim 1, wherein the first driving part turns off the first switching device upon detection of an overcurrent flowing through the first switching device due to a short-circuit failure of the second switching device, the second driving part turns off the second switching device upon detection of an overcurrent flowing through the second switching device due to a short-circuit failure of the first switching device, and the third driving part turns off the third switching device upon detection of an overcurrent flowing through the third switching device due to a short-circuit failure of one of the first switching device and the second switching device.

\* \* \* \* \*